United States Patent
Bayan et al.

(10) Patent No.: US 6,664,615 B1
(45) Date of Patent: Dec. 16, 2003

(54) METHOD AND APPARATUS FOR LEAD-FRAME BASED GRID ARRAY IC PACKAGING

(75) Inventors: Jaime Bayan, Palo Alto, CA (US); Anindya Poddar, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 45 days.

(21) Appl. No.: 09/990,083

(22) Filed: Nov. 20, 2001

(51) Int. Cl.[7] .............................. H01L 23/495
(52) U.S. Cl. .................. 257/666; 257/676; 257/690; 257/686; 257/787
(58) Field of Search ............... 257/737, 738, 257/734, 786, 784, 778, 678, 668, 698, 692, 693, 641, 690, 696, 676, 666, 787

(56) References Cited

U.S. PATENT DOCUMENTS

| | | | |
|---|---|---|---|
| 5,157,480 A | | 10/1992 | McShane et al. |
| 5,493,151 A | * | 2/1996 | Asada et al. .............. 257/686 |
| 5,665,651 A | * | 9/1997 | Asada et al. .................. 29/827 |
| 5,976,912 A | | 11/1999 | Fukutomi et al. |
| 5,990,545 A | * | 11/1999 | Schueller et al. ........... 257/697 |
| 6,025,640 A | * | 2/2000 | Yagi et al. ................... 257/666 |
| 6,034,441 A | * | 3/2000 | Chen .......................... 257/787 |
| 6,127,724 A | * | 10/2000 | DiStefano ................... 257/675 |
| 6,130,473 A | | 10/2000 | Mostafazadeh et al. |
| 6,232,661 B1 | * | 5/2001 | Amagai et al. ............. 257/737 |
| 6,246,117 B1 | * | 6/2001 | Ichinose ..................... 257/738 |
| 6,462,414 B1 | * | 10/2002 | Anderson ................... 257/738 |
| 2002/0185720 A1 | * | 12/2002 | Khan et al. ................. 257/678 |
| 2003/0006055 A1 | * | 1/2003 | Chien-Hung et al. ...... 174/52.1 |
| 2003/0057550 A1 | * | 3/2003 | Zhao et al. ................. 257/734 |
| 2003/0085459 A1 | * | 5/2003 | Akram et al. .............. 257/691 |
| 2003/0087478 A1 | * | 5/2003 | Kasuga et al. ............. 438/112 |

* cited by examiner

*Primary Examiner*—Nathan J. Flynn
*Assistant Examiner*—Pershelle Greene
(74) *Attorney, Agent, or Firm*—Beyer Weaver & Thomas LLP (57) ABSTRACT

Integrated circuit (IC) package structures and IC package fabrication techniques are provided. The IC package substrate is formed from a metal sheet that is patterned to form a substrate with pads and leads. These pads and leads are pattered throughout the substrate including at least part of the die mounting area. The die is mounted onto the die mounting area of the lead-frame, and respective bonding terminals on the die are electrically connected to the associated bonding areas on the patterned leads. A protective encapsulant is molded to cover the die, bond wires, and most, if not all, of the patterned substrate. Contacts for external electrical connection are formed onto the bottom of the pads.

22 Claims, 10 Drawing Sheets

METHOD AND APPARATUS FOR LEAD-FRAME BASED GRID ARRAY IC PACKAGING

FIELD OF THE INVENTION

The present invention relates generally to integrated circuit (IC) packages. More particularly, the invention relates to metal substrate IC packages use metal lead frames.

BACKGROUND OF THE INVENTION

The present invention combines the advantages of two types of IC packages: the Leadless Lead-frame Package (LLP) and the Ball Grid Array (BGA) package. A description of these two types of packages is presented here to better understand the object and advantages of their combination.

Figure 1A:
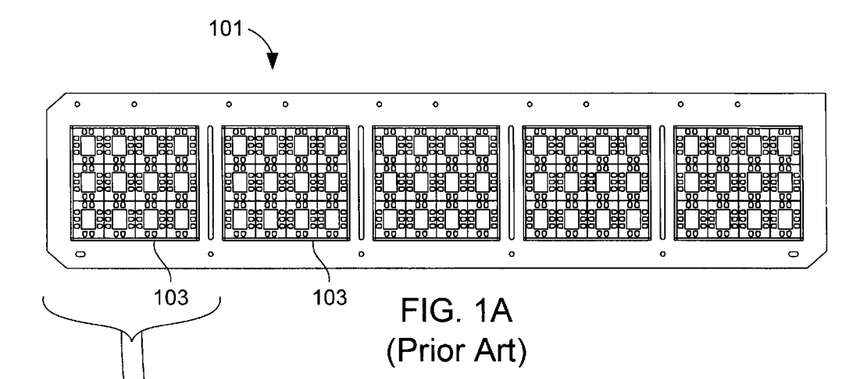
FIG. 1a is a diagrammatic top view of a known lead frame strip suitable for use in forming LLPs, with FIGS. 1b and 1c showing successively more detailed views of the elements in the strip.

A LLP is a surface mounted IC package that uses a metal, usually copper lead-frame substrate to form the IC package. As illustrated in FIG. 1a and the successively more detailed FIGS. 1b and 1c, in known LLPs, a copper lead-frame strip or panel 101 is patterned, usually by stamping or etching, to define a plurality of arrays 103 of chip substrates 105. Current LLP lead-frames are formed from metal sheets that are 8 mil thick. Each chip substrate 105 includes a die attach pad 107 and a plurality of contacts 109 disposed about associated die attach pad 107. Very fine tie bars 111 are used to support die attach pads 107 and contacts 109 during manufacturing.

During assembly, IC dice are attached to respective die attach pads 107 and conventional wire bonding is used to electrically couple bond pads on each die to associated contacts 109 on chip substrate 105. After the wire bonding, a plastic cap is molded over the top surface of each die and chip substrate 105 in array 103. The capped dice are then cut from the array and individually tested using known sawing and testing techniques.

Figure 2:
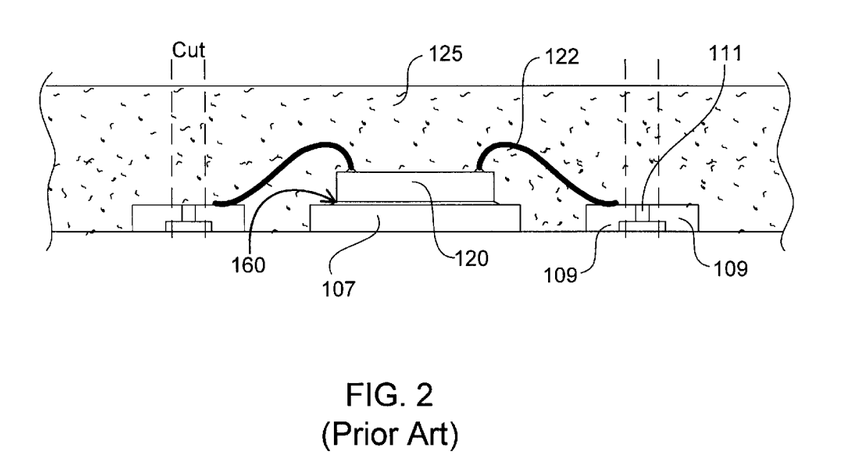
FIG. 2 is a cross sectional side view of a known LLP (Prior Art)

FIG. 2 shows a cross-section of a known LLP. The die attach pad 107 supports die 120, usually attached by an adhesive 160. Die 120 is electrically connected to its associated contacts 109 by bonding wires 122. A molded plastic cap 125 encapsulates the die 120 and bonding wires 122 and fills the gaps between the die attach pad 107 and the contacts 109 thereby holding the contacts in place. During singulation, tie bars 111 are cut. The resulting packaged chip can then be surface mounted on a printed circuit board or other substrate using known techniques.

To produce an LLP with a large number of contacts, LLP designers usually arrange the contacts in multiple rows on each side of the die. The maximum wire bonding distance and desired final package size determine the maximum number of rows of contacts that can be formed.

Figure 3:
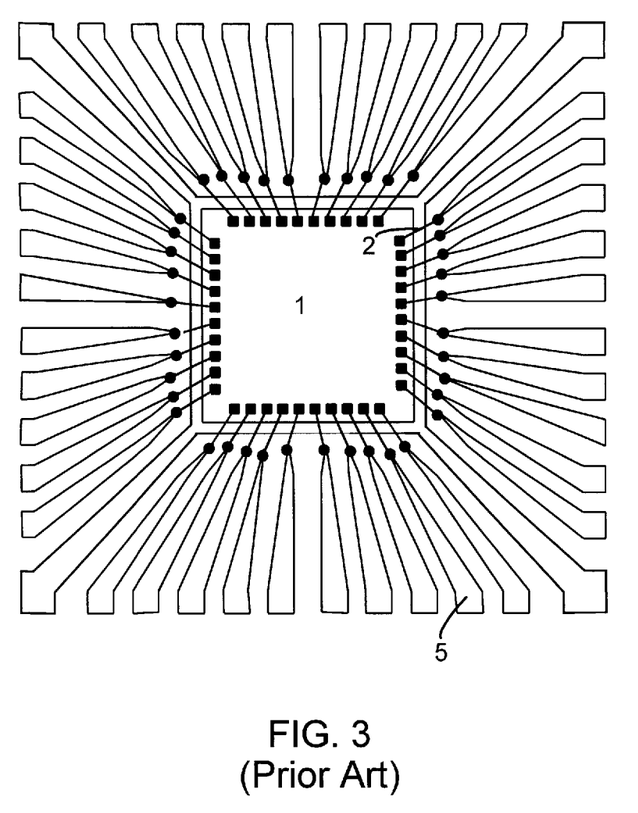
FIG. 3 illustrates a known patterned lead frame with leads (Prior Art)

Unlike an LLP that wire bonds directly from the die to the contacts, other known methods instead pattern the lead frame with leads, as shown FIG. 3. In this configuration, patterned leads 5 form a radial pattern extending away from the die. Die 1 is wire bonded to leads 5 by bonding wires 2 such that they do not cross any other leads prior to bonding. Although it is very cost effective, this configuration has the disadvantages of a finished package that is significantly larger than the die, and a relatively low contact distribution density.

The BGA package overcomes much of the contact density problem associated with high pin count lead-frame packages. The principle difference between BGA style packages and lead-frame style packages is that BGA style packages have a laminated substrate, similar to a PCB, instead of a patterned metal plate as used for lead-frames. Laminated substrates are further distinguishable from patterned lead-frame by their IC package contacts located below the die mounting area.

The BGA package is formed by using an array of interconnecting contacts made up of solder balls or solder columns between the IC of the package and other electrical components external to the package such as a PC board. Flip chip ICs and BGA packages are two common examples of packages that use these arrays of interconnecting contacts.

Figure 4A:
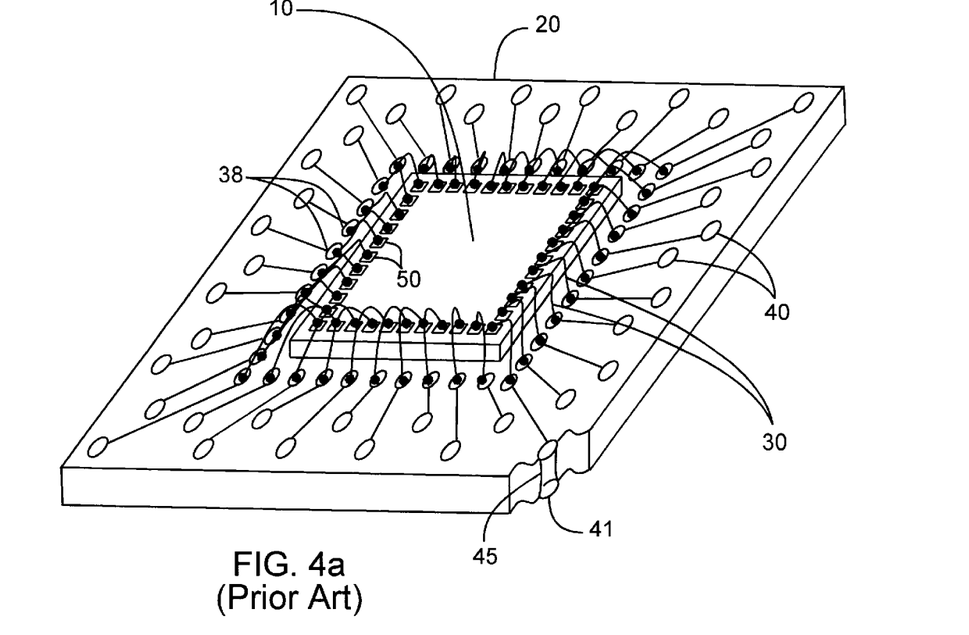
FIG. 4a shows a top view of a known BGA semiconductor package (Prior Art) and FIG. 4b is a cross sectional side view of the BGA shown in FIG. 4a (Prior Art)
Figure 4B:
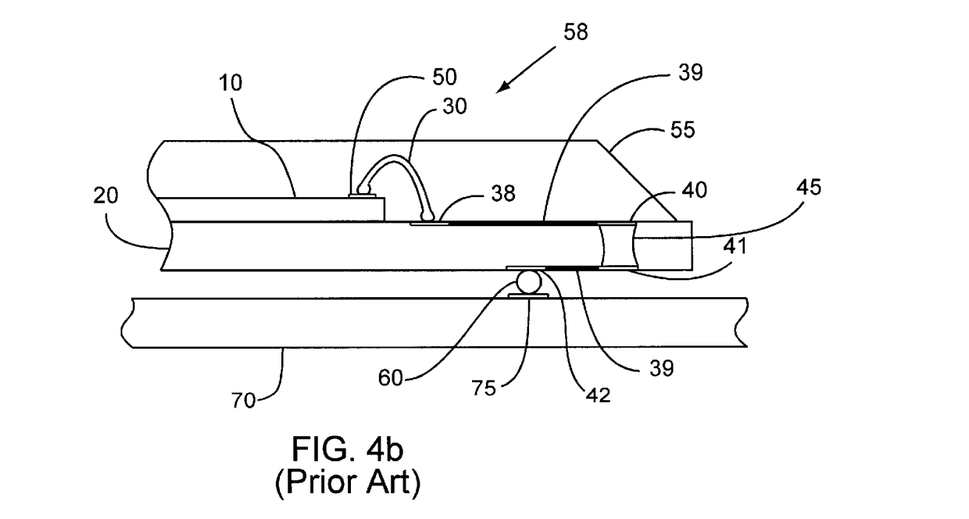

BGA and fine pitch BGA substrates are commonly used in semiconductor packages. Referring to FIGS. 4a and 4b, a semiconductor package utilizing a BGA substrate typically includes a semiconductor die 10 attached to a substrate 20. Die 10 usually includes a plurality of die bond pads 50. Substrate 20 typically includes a number of substrate pads 38 on the top surface of the substrate and a plurality of contacts 42 on the bottom surface of the substrate. Each substrate pad is typically electrically coupled to an associated contact 42 by way of traces 39 on the top and bottom surface of the substrate and associated vias 45 that electrically couple the top and bottom traces. The vias 45 typically have associated upper and lower via pads 40 and 41 to facilitate electrically coupling the vias to their associated traces 39. The substrate pads 38, traces 39 and via pads 40 and 41 are typically plated as a single layer on either surface of the substrate. Substrate pads 38 are typically positioned as close to die 10 as practically possible to minimize the length of bonding wires 30 necessary to couple die bond pads 50 to substrate pads 38. Thus, the pitch of the substrate pads (i.e. the distance between the centers of adjacent substrate pads) tends to be quite fine to accommodate a relatively large number of bond pads 50 on the die. In contrast, vias 45 and via pads 40 and 41 are typically placed towards the periphery of substrate 20 since processing technology requires that they be spaced further apart than the substrate pads.

After die 10 has been properly attached and electrically coupled to substrate 20, the upper surface of BGA substrate 20 is often encapsulated by an encapsulating material 55. The finished semiconductor package 58 is usually cured to harden the encapsulating material 55. Typically, solder balls are formed on contacts 42, although other types of mounting contacts can be formed. When the semiconductor package 58 is attached to a printed circuit board 70, the solder balls 60 are reflowed to electrically and physically couple semiconductor package 58 to pads 75 on printed circuit board 70. Laminated substrates 20 are relatively thick as compared to lead-frames.

One problem with standard BGA packages is that substrate 20 is typically custom made to fit the specific requirements of a particular die. The die sizes, the die shapes, the number of I/O terminals (bond pads) per die as well as the bond pad pitch will often vary significantly for different devices, thus driving a requirement for custom substrate designs. A serious problem with BGA substrates is the amount of time required to manufacture them. Although the cycle time for dies has dramatically decreased, so that a die can now be manufactured within days, cycle times for manufacturing BGA substrates may be significantly longer. Generally, much of the delay in the production of BGA substrates is due to the intricate placement and routing of substrate input/output pads 38, via pads 40 and 41 and contacts 42.

BGA substrates also need custom tool testing equipment to handle each new BGA substrate. As custom BGA substrates typically have different footprints, and vary in size and pitch, testing equipment must be reconfigured for each semiconductor device. This results in increased cost and logistical problems for BGA IC device makers. Typically, the BGA substrate accounts for about 50 percent of the total BGA IC device cost.

The BGA package has the advantage over the LLP of a higher contact density. This translates to a smaller printed circuit board (PCB) footprint for an IC package with a given number of contacts. One reason for this is that the BGA has a much higher routing density and locates contacts below the die area, whereas the LLP must directly wire bond to peripheral contacts located beyond the boundaries of the die attachment plate. BGAs can scale up to much higher contact counts by using high density traces routed in the BGA substrate, overcoming much of the bonding density and distance limitations experienced by LLPs. Moreover, the longer bond wires required in LLP multi row contact arrangements introduce significantly higher parasitic inductance into the contacts than do traces in the BGA substrate.

Figure 5:
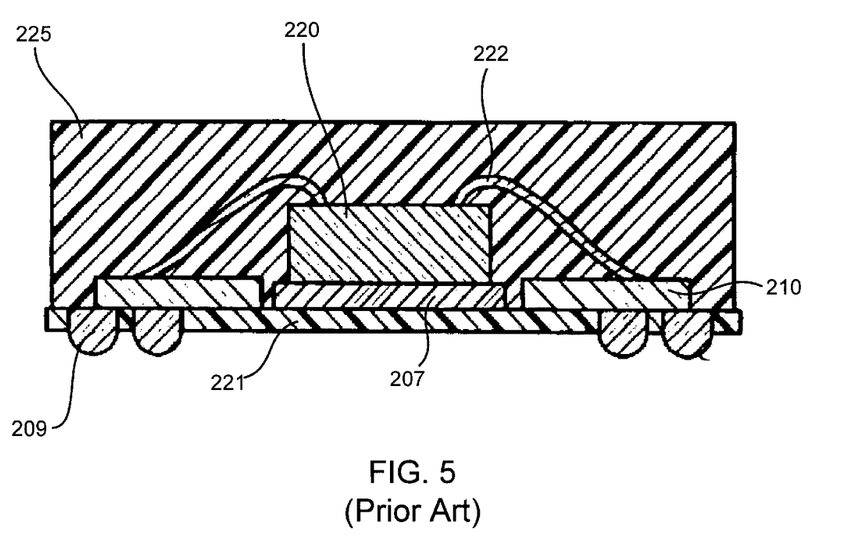
FIG. 5 is a cross sectional side view of a known IC package using a patterned lead-frame with contacts formed below the lead-frame (Prior Art)

One known method works towards combining the advantages of lead-frame and BGA packages is shown in U.S. Pat. No. 5,976,912, by Fukutomi et al., issued Apr. 21, 1998, ("Fukutomi"). As shown in FIG. 5, Fukutomi prescribes a patterned lead-frame that is etched from a copper foil to form a wiring pattern 210. Importantly, die attach area 207 is not patterned. Die 220 is mounted onto die attach area 207. Bonding wires 222 connect the I/O terminals of die 220 to wiring pattern 210. The top lead-frame surface, bonding wires, and die are encapsulated by protective encapsulant 225. The bottom surface of the lead-frame is coated with a dielectric that leaves exposed locations of the wiring pattern where solder balls 209 are formed and attached, resulting in an electrical path from the solder balls to the corresponding die I/O terminals. The resulting IC package is connected to an external PCB 221 via the solder balls. Although Fukutomi improves on both LLP and BGA packages, it does not use the area below die 220 for patterning and contacts, resulting in a lower number of contacts 209 than would otherwise be possible.

An IC packaging method and apparatus that more fully integrates the advantages of BGA and LLP technology into one unified design is therefore desirable.

SUMMARY OF THE INVENTION

An improved integrated circuit (IC) package structure and IC package fabrication techniques are herein described. The present package substrate is formed from a metal sheet that is patterned to form a patterned device area with contact pads and leads. These contact pads and leads are patterned throughout the device area including at least part of the die mounting area. The die is mounted onto the die mounting area of the patterned device area and respective bonding terminals on the die are electrically connected to associated bonding areas on the patterned device area. A protective encapsulant is molded to cover the die, bond wires, and most, if not all, of the patterned device area. Contacts for external electrical connection are formed onto the bottom of the pads.

In another embodiment, a shield is provided that covers a portion of the device area. The shield is electrically connected to at least one of the patterned leads.

Other features, advantages, and objects of the present invention will become more apparent and be more readily understood from the following detailed description, which should be read in conjunction with the accompanying drawings.

BRIEF DESCRIPTION OF THE DRAWINGS

The present invention is illustrated by way of example, and not by way of limitation, in the figures of the accompanying drawings and in which like reference numerals refer to similar elements and in which:

FIG. 6a illustrates a 64 pin lead-frame patterned according to an embodiment of the present invention and FIG. 6b shows an IC die coupled to the patterned lead-frame shown in FIG. 6a;

DETAILED DESCRIPTION OF THE PREFERRED EMBODIMENTS

The present invention is an IC package that creates contact pads distributed throughout a metal lead-frame substrate of an IC package, including the die mounting area. The completed IC package can have a similar external appearance and utility as a ball grid array (BGA) or land grid array (LGA) IC package.

Figure 6A:
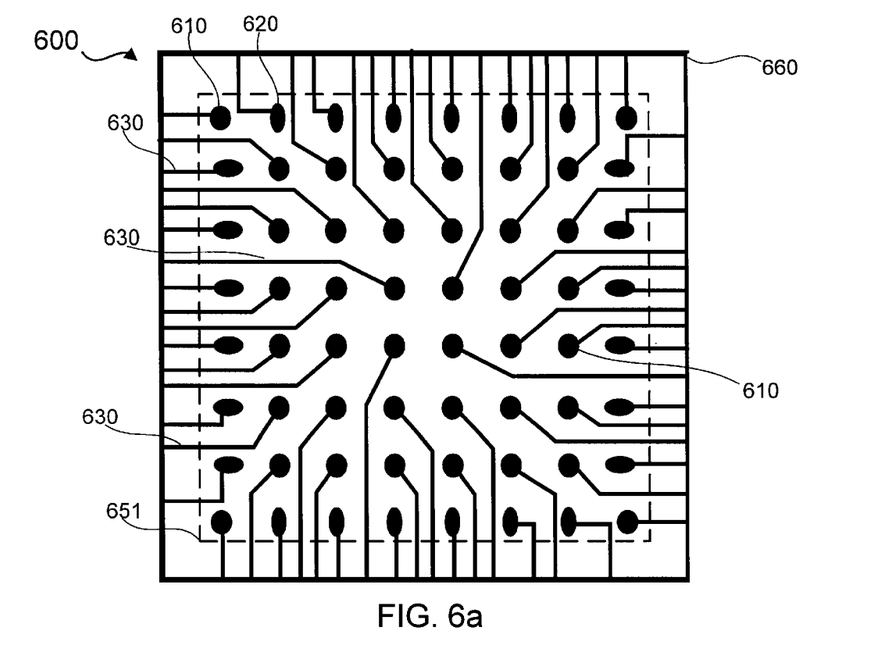
Figure 6B:
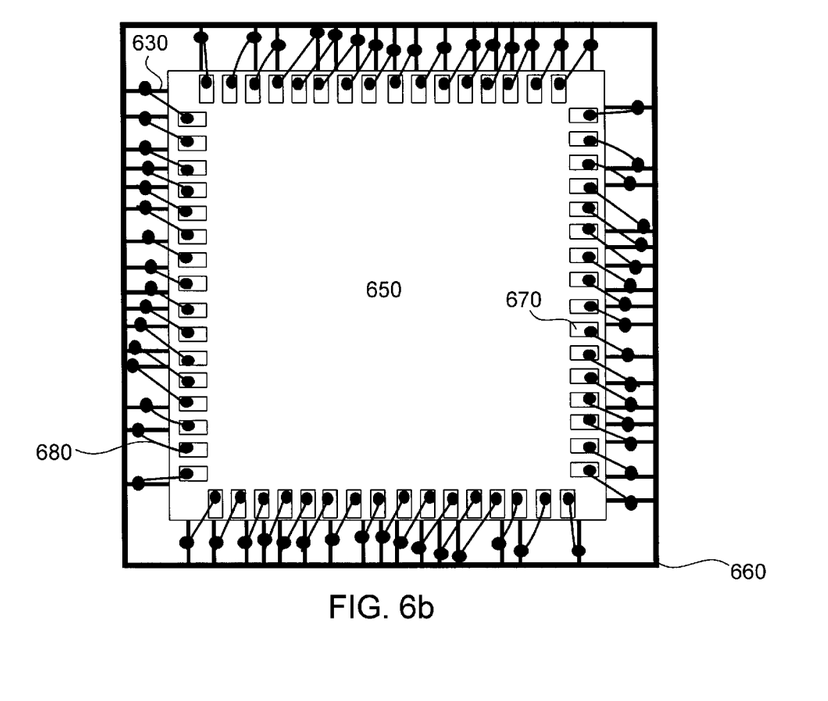

FIG. 6a illustrates a 64 pin lead-frame patterned according to an embodiment of the present invention. FIG. 6b illustrates a die connected to the patterned lead-frame shown in FIG. 6a. IC substrate 600 comprises a patterned metal lead-frame device area. Usually, the device areas are patterned from a larger metal sheet that is patterned to define a multiplicity of such device areas that are adjacent to one another and connected by metal tie bars 660. The salient features of IC substrate 600 are substrate leads 630, circular pads 610 and oblong pads 620. The substrate area is almost equal to the die mounting area shown by die attach area 651

(dashed box). Substrate pads 610 and 620 in the die attach area have substrate leads 630 that are routed to the outer periphery of the patterned substrate. As shown in FIG. 6b, die 650 is attached to die attach area 651 (FIG. 6a) and die terminals 670 are electrically connected by any suitable method, such as down-bonding bond wires 680, to associated substrate leads 630 on the periphery of IC substrate 600. Die 650 may be attached to die attach area 651 by such adhesives as a non-conductive resin.

The choice of pad shapes, lead width, and lead routing patterns is usually driven by the quantity and placement of IC package contacts that are attached to the bottom side of substrate pads 610 and 620. The routing difficulty of the substrate leads is proportional to the pad shapes and density. The minimum pitch capability of a given patterning technology will usually determine how many leads may be formed between two pads, resulting in a potential limit to the maximum number of IC package contacts possible for a given patterning technology. This maximum may be reached when the number of substrate leads 630 that can be reliably formed between two substrate pads is insufficient to route leads from more centrally located pads to the outer periphery of the patterned substrate. For current BGA specifications, technology permits routing at least three leads between pads. Thus, significantly higher contact densities than shown in FIG. 6a are possible. Modifying pad shapes is another way to increase the number of leads that can be routed between pads. Instead of having a circular shape, as substrate pads 610 do, substrate pads 620 on the substrate's periphery are oblong to permit the routing of more leads in between adjacent oblong pads. A similar approach could be used on inner pad rows when a higher substrate pad density is required. The substrate pads may be distributed or used in a variety of different and contemplated ways. For example, instead of connection to die terminals, pads towards the center of the die and below the die could be used as thermal pads to dissipate heat through the contacts into the PCB.

Figure 7A:
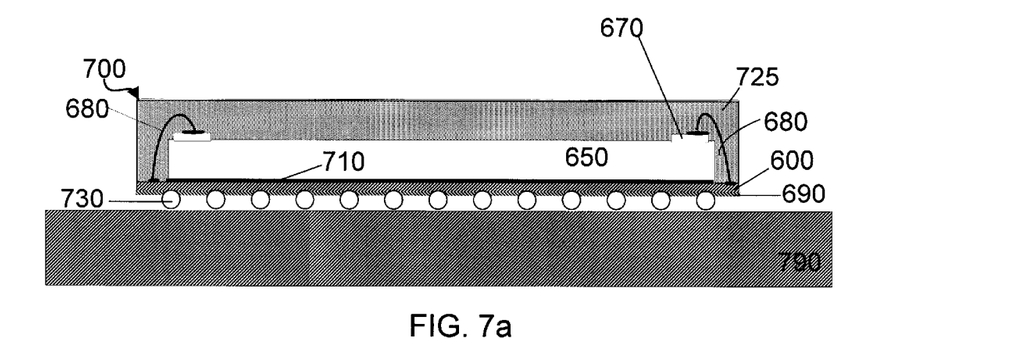
FIG. 7a is a side cross-sectional view of a completed IC package with BGA style contacts for PCB mounting, according to an embodiment of the present invention.

FIG. 7a is a side cross-sectional view of a completed IC package with BGA style contacts for PCB mounting, according to a first embodiment of the present invention. The BGA package formed according to the present invention has a substrate formed by patterned lead-frame 600. Die 650 is attached to lead-frame 600 by die attachment material 710. By way of example, the die attachment material could be a B-stageable layer, or a programmable epoxy that applies a prescribed amount of epoxy onto desired locations on patterned lead-frame 600. The die, bond wires, and patterned lead-frame are protectively encapsulated by encapsulant 725. By way of example, the encapsulant could be molded plastic. The exposed bottom surface of IC package 700 has a dielectric 690 that covers the lower side of the patterned lead-frame while leaving open areas where conductive balls 730 are attached. The conductive balls are made of solder, or similar materials, to facilitate the attachment process. The dielectric protects against short circuits between the patterned lead-frame and external circuits. In other embodiments, this dielectric may not be required. IC package 700 is electrically connected to a mounting area on PCB 790 by reflowing solder balls 730. The overall vertical thickness of IC package 700 is significantly less than both known LLP and BGA style packages. Under current technology, IC packages formed according to the present invention are about 0.1 mm thick. This very thin profile is possible because lead-frame 600 is patterned from a very thin metal foil, currently 4 mil thick.

Figure 7B:
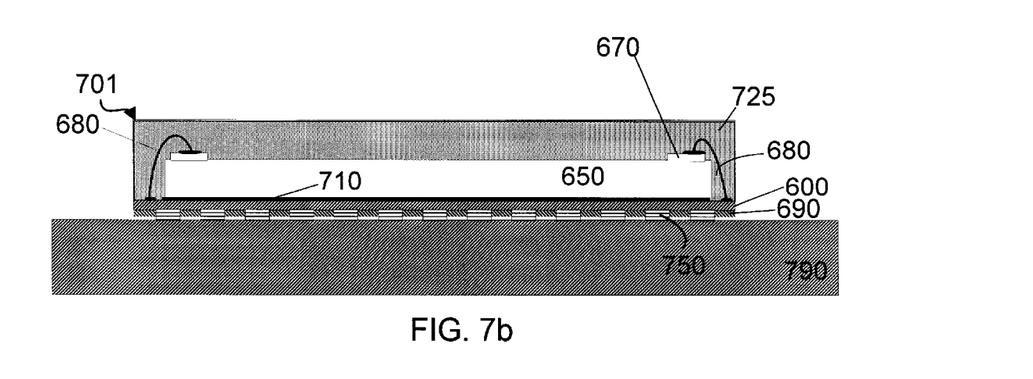
FIG. 7b is a side cross-sectional view of a completed IC package with LGA style contacts for PCB mounting, according to an embodiment of the present invention.

FIG. 7b is a side cross-sectional view of a completed IC package with plated land grid array (LGA) style contacts for PCB mounting, according to a another embodiment of the present invention. This embodiment is the same as the first embodiment except that instead of ball style contacts that can be reflowed for PCB connection, the second embodiment has flush, surface mountable contacts 750 that are connected to the bottom side of the respective pads in lead-frame 600. The surface mountable contacts could be formed by any standard method such as plating using gold and nickel.

Figure 8A:
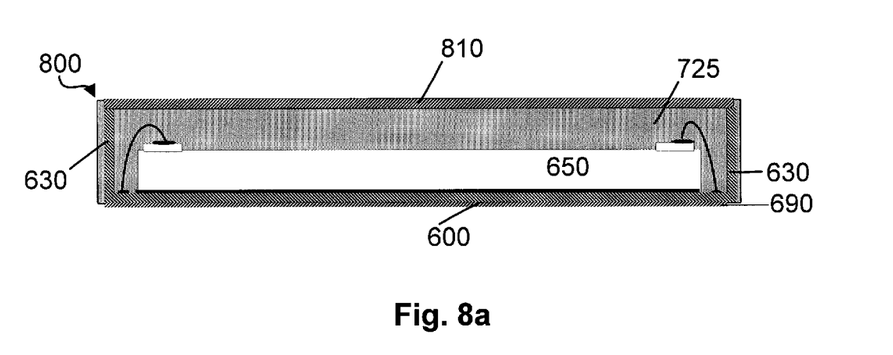
FIG. 8a illustrates another embodiment of the present invention where the patterned lead-frame connects to a shield on the top surface of the IC package and FIG. 8b illustrates another embodiment of the present invention where the patterned lead-frame connects to a shield embedded in the encapsulant of the IC package.
Figure 8B:
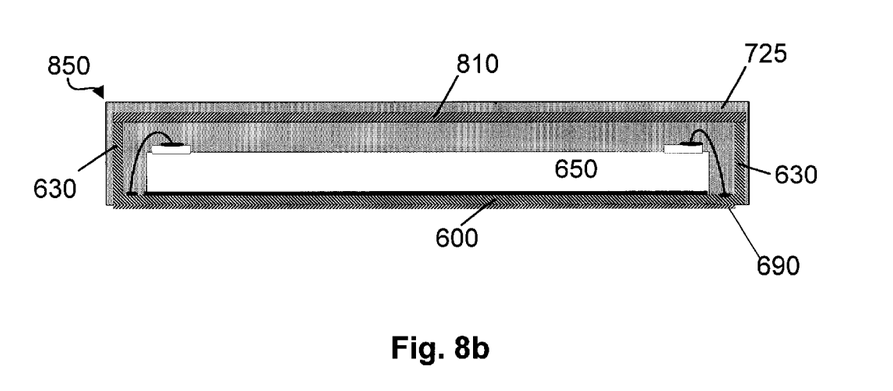

FIG. 8a illustrates another embodiment of the present invention wherein patterned lead-frame 600 connects to a shield on the top surface of the IC package. Referring to FIG. 6a and FIG. 8a, leads 630 in the patterned lead-frame can be selectively patterned to be long enough to be flipped up and electrically joined to conductive shield 810. Conductive shield 810 is exposed at the top surface of IC package 800. This alternative embodiment provides Faraday shielding which at least partially protects electrical components within IC package 800 from electromagnetic interference (EMI), and further provides an exposed shield surface for possible external electrical device connection. FIG. 8b illustrates yet another embodiment of the present invention where the patterned lead-frame connects to a shield embedded in the encapsulatent of the IC package. This alternative embodiment is identical to the embodiment shown in FIG. 8a except that shield 810 is contained within encapsulant 725. In the embodiments of FIGS. 8a and 8b, conductive shield 810 may cover an area that is less than the whole IC package. For example, the shield could be simply a strip through the middle of the IC package that provides EMI shielding for sensitive high gain circuitry on the die located just below the shielding strip.

Figure 9A:
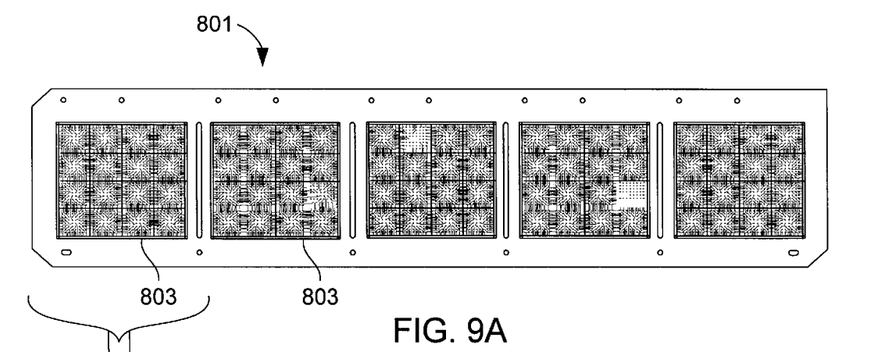
FIG. 9a is a top view of a lead frame strip suitable for use in forming IC packages as prescribed by the present invention, with FIGS. 9b and 9c showing successively more detailed views of the elements in the strip.
Figure 9B:
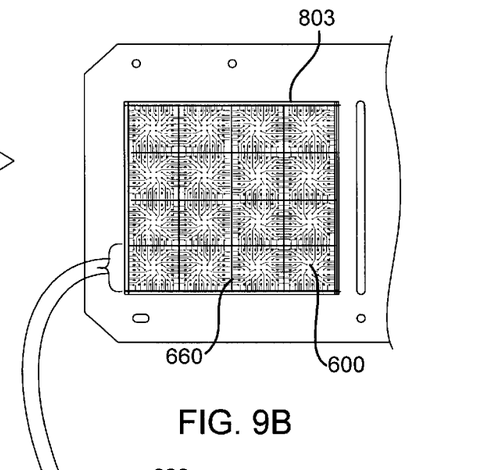
Figure 9C:
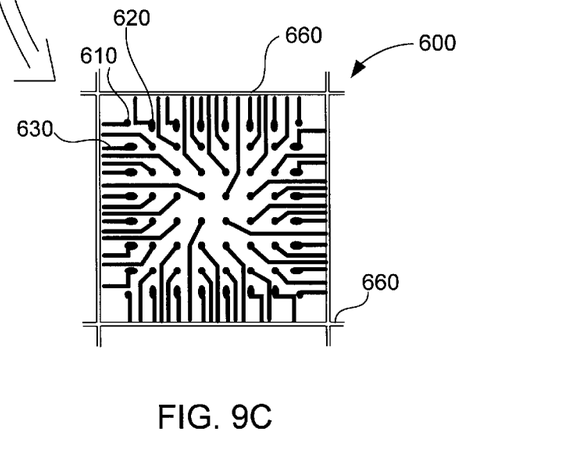
FIG. 9c is a single device area consisting of a patterned substrate.

FIG. 9a is a top view of a lead frame strip suitable for use in forming IC packages as prescribed by an embodiment of the present invention, with FIGS. 9b and 9c showing successively more detailed views of the elements in the strip. FIG. 9c is a single device area consisting of a patterned substrate.

Figure 1B:
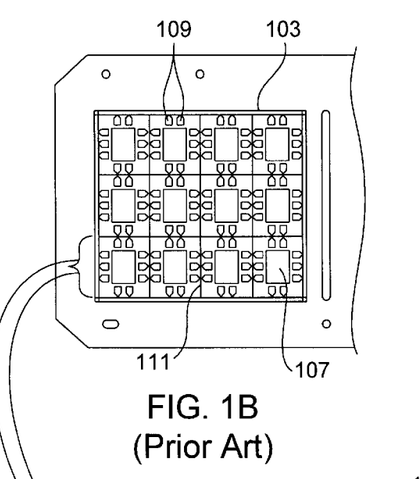
Figure 1C:
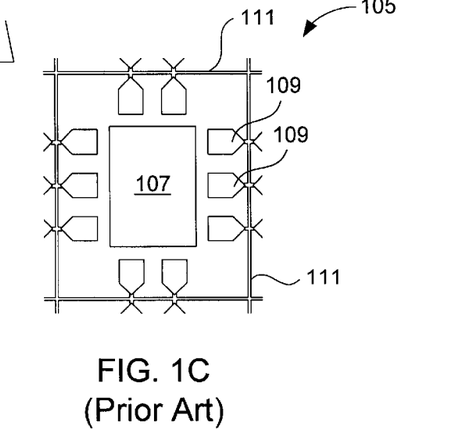
FIG. 1c is a single LLP element consisting of a substrate and contacts (Prior Art)

FIGS. 9a, 9b and 9c illustrate a manufacturing panel structure similar to FIGS. 1a, 1b and 1c but directed, however, to the present invention. Device areas 600 are similar to the pre-singulated patterned substrates shown in FIG. 6a. The panel assembly 801 is suitable for use in packaging an array of integrated circuits. During assembly, IC dice are attached to respective die attach areas in device areas 600 and conventional wire bonding can be used to electrically couple terminals (bond pads) on each die to associated bonding locations on pre-singulated patterned substrates 600. After the wire bonding, a cap is formed over the top surface of each die and patterned substrates 600 in array 803. By way of example, the cap can be a suitable molded plastic. The capped dice are then cut away from tie bars 660 and individually tested using known sawing and testing techniques.

Figure 10:
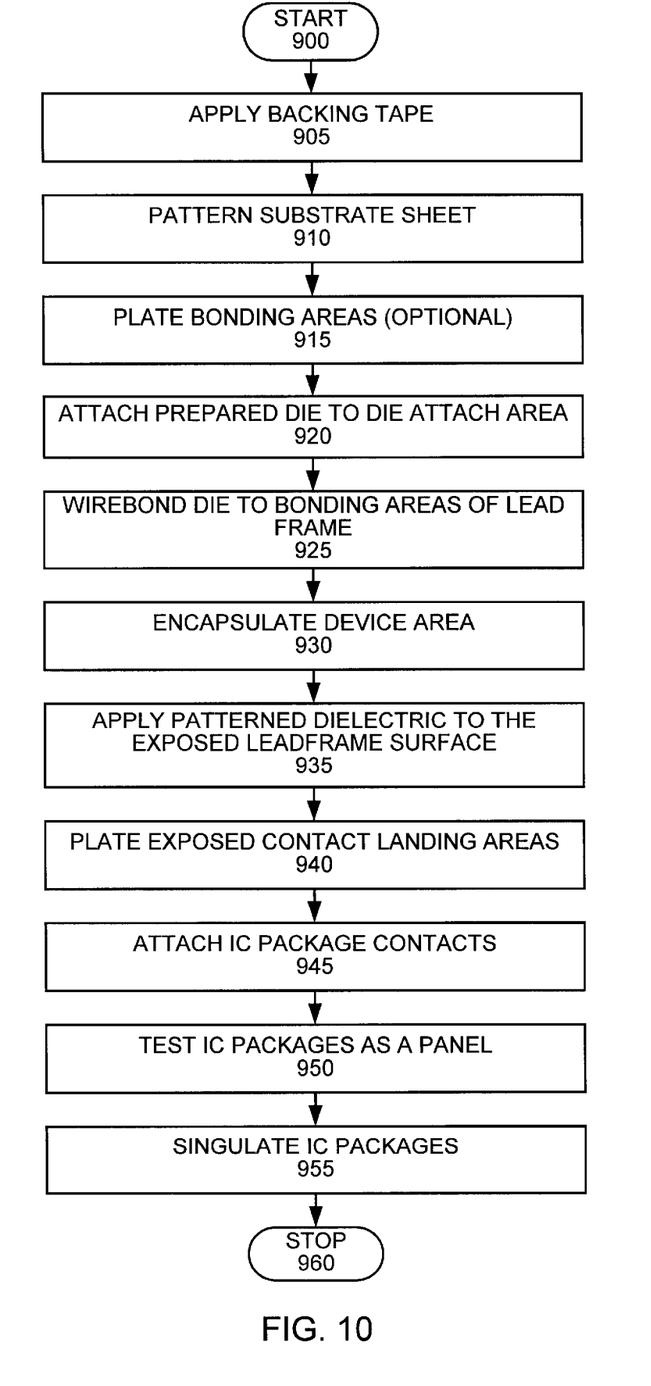
FIG. 10 is a flow chart illustrating the process steps used to form IC packages according to at least one embodiment of the present invention.

FIG. 10 is a flowchart illustrating the process steps suitable to manufacture embodiment of the present invention. The process uses lead-frame processing techniques, directed and extended to the present invention. A metal sheet is patterned into a multiplicity of device areas, where dice will be mounted and connected to leads and then encapsulated to form an IC package. Referring to both the process steps in FIG. 10 and the panel elements in FIGS. 9a, 9b and 9c, the process begins (step 900) with a first sheet of metal that has a top and bottom surface. In current process technology, the metal sheet is 4 mil thick copper. Because the patterned structures are very delicate, the process designer may wish to apply a backing tape to the bottom metal sheet surface (step 905) to hold patterned features in place. Any suitable method of holding patterned features in place will work. Depending on the particular implementation, it may be that leads 630 are still physically connected to tie bars 660 of the panel after patterning. In this case, no temporary tape backing is necessary to protect the leads from handling by the processing equipment. The metal sheet is patterned (step 910), by any suitable patterning method, into lead frame panel assembly 801, which includes a lead frame panel with a multiplicity of device areas 600 that are adjacent to one another. By way of example, patterning techniques such as chemical etching or machining can be used. After patterning, each device area has the necessary pads and leads to make it suitable for use as part of an independent IC package. The following steps mount the dice and connect them to the appropriate leads in the device areas. The particular order or necessity of these steps depends on the processing equipment used. For example, current technology uses known wire bonding methods to electrically connect die pads to leads in the lead-frame. This requires solder wetting step 915 to assure reliable wire bonding by plating lead bonding areas with silver. This is an optional step, as it may not be required by other connection techniques. Likewise, any suitable method of attaching the dice to the patterned substrate (step 920) may be used. By way of example, die attachment can be accomplished by applying a B-stageable material to the backside of the wafer, whereby the singulated die is pressured onto the die attach area of the patterned lead-frame, and then cured. In another example, a programmable epoxy may deposit a certain amount of epoxy at predetermined locations on the patterned lead-frame, whereby the singulated die is pressured onto the epoxy and cured. Referring to FIG. 10 and FIG. 6b, the device is completed using known methods wherein die I/O (input/output) signal lines are electrically connected by methods such as wire bonding from die terminals 670 to their associated leads 630 (step 925). Referring to FIG. 10 and FIG. 7a, cap 725 is formed (step 930), using molded plastic for example, to encapsulate die 650 and bonding wires 680 and fills the gaps between leads in patterned lead-frame 600, thereby holding the leads in place. With the leads held in place by the encapsulant, the backing tape applied to the bottom metal sheet surface may be removed at any point hereon. In step 935, patterned dielectric 690 is applied to the exposed lead-frame surface, leaving exposed the locations where contacts will be attached. These exposed lead-frame locations are plated by known methods, including nickel or tin solder (step 940). As shown respectively by contacts 730 and 750 in FIGS. 7a and b, more than one type of contact may be formed (step 945). Many other types of contacts can be formed as required by the application. The devices on the panel are tested (step 950). To test circuits in the individual die, the panel can be partially cut to electrically isolate each device area, while retaining the rigidity of the panel. By way of example, this could be achieved by cutting the panel from the bottom deep enough to cut the substrate leads from panel tie bars but not cutting the encapsulant. After testing, the device areas are completely cut away from the panel, or singulated (step 955) and the resulting packaged chip can be physically and electrically attached to a printed circuit board or other substrate using known techniques. The described steps are exemplary and in several circumstances the order of the various steps may be changed, some steps eliminated or combined, and others added.

Although only a few embodiments of the present invention have been described in detail, it should be understood that the present invention may be embodied in many other specific forms without departing from the spirit or scope of the invention. Particularly, in the illustrated embodiments the contacts were shown to be arranged into a full grid array covering the entire die attach area. However, if fewer contacts, or an alternate contact distribution is required, the patterned pads and leads can be otherwise located as prescribed by the present invention. The materials used to form the patterned lead frame structure, and the shape of the pads and leads may be widely varied. Moreover, any available contacts can, instead of being electrically connected to the die terminals, be thermally connected to the die to dissipate heat into the PCB. Also, although only a single die was shown in the illustrated embodiments, the lead-frame can be patterned according to the present invention for the mounting of multiple dice. Therefore, the present examples are to be considered as illustrative and not restrictive, and the invention is not to be limited to the details given herein, but may be modified within the scope of the appended claims.

We claim:

1. An integrated circuit package comprising:
    a lead-frame having a die mounting area and a multiplicity of bonding locations, the lead frame being patterned to form a plurality of leads and contact pads, wherein at least some of the contact pads are formed within the die mounting area;
    a die having a multiplicity of I/O pads, wherein the die is carried by the die mounting area of the lead frame;
    a plurality of electrically conductive connections connecting the respective I/O pads on said die to bonding locations on the lead-frame;
    an encapsulant that covers the die and at least a portion of the lead-frame, wherein at least a portion of the lead-frame is left exposed, the exposed lead-frame including at least one exposed contact pad.

2. An integrated circuit package as recited in claim 1 further comprising an adhesive between the die and patterned lead-frame.

3. An integrated circuit package as recited in claim 2 wherein the adhesive is a programmable epoxy resin.

4. An integrated circuit package as recited in claim 1 further comprising an electromagnetic shield in or on the encapsulant, the shield covering at least part of the lead-frame, the shield being electrically connected to at least one of the patterned leads.

5. An integrated circuit package as recited in claim 1 further comprising a dielectric that covers at least part of the exposed patterned lead-frame.

6. An integrated circuit package as recited in claim 1 wherein solder balls or plates are formed on the at least one exposed contact pad.

7. An electronic module comprising:
    a printed circuit board; and
    an integrated circuit package as recited in claim 1, wherein the printed circuit board carries the integrated circuit package.

8. A panel assembly suitable for use in packaging a plurality of integrated circuits, the panel assembly comprising:
    a lead frame panel formed from a conductive sheet, the lead frame panel being patterned to define a plurality of adjacent device areas, each device area being suitable for use as the lead-frame of an integrated circuit package as recited in claim 1.

9. A lead frame for use in an integrated circuit package, the lead frame comprising a multiplicity of leads, wherein at least a plurality of the leads have contact pads integrally formed therewith that are suitable for forming exposed external contacts, the contact pads having a larger width or diameter than an immediately adjacent portion of the associated leads, the lead frame further including a die mounting area wherein at least one of the contact pads is positioned within the die mounting area.

10. A panel assembly suitable for use in packaging a plurality of integrated circuits, the panel assembly comprising:

a lead frame panel formed from an electrically conductive sheet, the lead frame panel being patterned to define a plurality of device areas, each device area being suitable for use as the lead-frame recited in claim 9.

11. The panel assembly as recited in claim 10, wherein the plurality of device areas comprise a two dimensional array of immediately adjacent device areas.

12. The panel assembly as recited in claim 10, further comprising:

a plurality of integrated circuits mounted on associated die mounting areas, the integrated circuits each having a plurality of I/O pads;

a plurality of bonding wires that electrically interconnect I/O pads on the integrated circuits and associated bonding locations on the lead-frame panel; and an encapsulant that covers the integrated circuits and bonding wires and at least a portion of the lead-frame while leaving a bottom surface of the lead-frame at least partially exposed.

13. The panel assembly as recited in claim 12, further comprising:

a patterned dielectric covering at least a part of the exposed lead-frame surface, wherein the dielectric patterning leaves exposed at least some portion of the contact pads; and least one contact electrically coupled to at least one of the exposed contact pads, whereby the contacts may be used to electrically couple electrical devices to the patterned leads.

14. A method to make a lead-frame suitable for semiconductor packaging comprising the steps of:

patterning an electrically conductive sheet, the patterning forms at least one device region having leads and contact pads, the device region further having a die mounting area, wherein the die mounting area includes at least one contact pad.

15. The method to make a lead-frame assembly comprising the steps of:

attaching at least one die to associated die mounting areas in the lead-frame formed as recited in claim 14, the die having a plurality of I/O bond pad; and electrically connecting die I/O bond pads to leads in the device region.

16. The method recited in claim 15, wherein the die is attached by a programmable epoxy resin.

17. The method of making semiconductor packaging comprising the steps of:

molding an encapsulant over the lead-frame assembly formed as recited in claim 15, wherein the encapsulant covers the die, the electrical connections and at least a portion of the patterned device region, leaving a surface of the sheet at least partially exposed.

18. The method recitied in claim 17, wherein a shielding area is formed in or on the encapsulant, the shield covering at least part of the die, wherein the shielding area is electrically connected to at least one of the patterned leads to provide at least partial electromagnetic shielding to the die or its electrically conductive connections.

19. The method recited in claim 17, further comprising the steps of:

patterning a dielectric to cover at least a part of the exposed lead-frame surface, wherein the dielectric patterning leaves exposed at least some portion of the contact pads; and forming a multiplicity of electrically conductive contact on the exposed contact pads, whereby the contacts may be used to electrically couple electrical devices to the patterned leads.

20. The method recited in claim 19, further comprising the steps of: singulating the device regions into individual semiconductor packages.

21. A packaged semiconductor device comprising:

a conductive lead-frame having a die mounting area, the lead frame being patterned to form a plurality of leads and a plurality of contact pads, wherein at least some of the contact pads are formed within the die mounting area;

a die having a multiplicity of I/O pads, wherein the die is carried by the die mounting area of the lead frame;

a plurality of conductors arranged to electrically connect the respective I/O pads on said die to associated leads in the lead-frame;

an encapsulant that covers the die and at least a portion of the lead-frame, wherein at least the contact pad portions of the lead-frame are left exposed.

22. A panel assembly suitable for use in an integrated circuit packaging, the panel assembly comprising:

a lead frame panel patterned to define at least one two dimensional array of substantially immediately adjacent device areas, wherein each device areas includes a plurality of leads and a plurality of contact pads;

a plurality of dice, each die being mounted on an associated device area, the die being mounted over at least some of the contact pads and electrically connected to associated leads in the associated device area; and at least one encapsulant cap that covers an associated two dimensional array of immediately adjacent device areas while leaving the contact pads exposed, whereby at least some of the exposed lead frame contact pads are located below the dice.

* * * * *